(12) United States Patent
Silvkoff et al.

(10) Patent No.: US 6,601,130 B1
(45) Date of Patent: Jul. 29, 2003

(54) MEMORY INTERFACE UNIT WITH PROGRAMMABLE STROBES TO SELECT DIFFERENT MEMORY DEVICES

(75) Inventors: William J. Silvkoff, San Jose, CA (US); Frank S. Lee, San Jose, CA (US); William W. Kolb, Sunnyvale, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/198,925

(22) Filed: Nov. 24, 1998

(51) Int. Cl.[7] ............................................. G06F 12/00
(52) U.S. Cl. ...................................... 711/5; 365/230.03
(58) Field of Search ........................... 711/5, 112, 127; 713/1, 2; 365/230.03, 230.04

(56) References Cited

U.S. PATENT DOCUMENTS

| 4,028,682 A | | 6/1977 | Weber et al. | |
| 4,349,870 A | | 9/1982 | Shaw et al. | |
| 4,903,197 A | * | 2/1990 | Wallace et al. | 711/5 |
| 5,261,116 A | | 11/1993 | Agrawal | |
| 5,598,372 A | * | 1/1997 | Matsumoto et al. | 365/230.01 |
| 5,715,207 A | | 2/1998 | Cowell | |
| 5,761,478 A | | 6/1998 | Chen et al. | |
| 5,781,492 A | * | 7/1998 | Gittinger et al. | 365/203.01 |
| 5,966,727 A | * | 10/1999 | Nishino | 711/127 |
| 6,023,750 A | * | 2/2000 | Hansen et al. | 711/220 |

FOREIGN PATENT DOCUMENTS

| GB | 2 271 003 A | 3/1994 |
| JP | 09 180431 A | 7/1997 |

* cited by examiner

*Primary Examiner*—Matthew Kim
*Assistant Examiner*—Matthew D. Anderson
(74) *Attorney, Agent, or Firm*—Gwenaelle LePennec

(57) ABSTRACT

A memory interface unit for coupling a microprocessor to a memory external to the microprocessor. The memory comprises a plurality of memory banks of mixed type, generic memory banks such as ROM, EPROM, or the like, which are directly addressable, and DRAM memory banks, which are addressable by row and column addresses, validated by row and column strobes. The memory interface provides unique strobes for each of the memory banks, which are programmable in dependence of the type of memory bank to which a particular strobe relates. The unique strobes are programmable so as to support both generic memory and DRAM, as the case may be.

19 Claims, 10 Drawing Sheets

| NAME | DESCRIPTION | SFR ADDRESS | BIT FUNCTIONS AND ADDRESSES ||||||||| RESET VALUE |
| | | | MSB |||||||| LSB | |
|---|---|---|---|---|---|---|---|---|---|---|---|
| BTRH | BUS TIMING REG HIGH | 469h | | | | | | | | | | FFh |
| BTRL | BUS TIMING REG LOW | 468h | | | | | | | | | | EFh |
| MRBL | MMR BASE ADDRESS LOW | 496h | | | MA15 | MA14 | MA13 | MA12 | • | • | MRBE | x0h |
| MRBH | MMR BASE ADDRESS HIGH | 497h | | | MA23 | MA22 | MA21 | MA20 | MA19 | MA18 | MA17 | MA16 | xx |
| MICFG | | 499h | | | | • | • | • | • | • | • | CLK0E | 01h |

FIG. 4

| MEMORY INTERFACE (MIF) REGISTERS | | | | |
|---|---|---|---|---|
| B0CFG | R/W | 8 | 280h | MIF BANK 0 CONFIG |
| B0AM | R/W | 8 | 281h | MIF BANK 0 BASE ADDRESS |
| B0TMG | R/W | 8 | 282h | MIF BANK 0 TIMING PARAMS |
| | R/W | | | |
| B1CFG | R/W | 8 | 284h | MIF BANK 1 CONFIG |
| B1AM | R/W | 8 | 285h | MIF BANK 1 BASE ADDRESS |
| B1TMG | R/W | 8 | 286h | MIF BANK 1 TIMING PARAMS |
| | R/W | | | |
| B2CFG | R/W | 8 | 288h | MIF BANK 2 CONFIG |
| B2AM | R/W | 8 | 289h | MIF BANK 2 BASE ADDRESS |
| B2TMG | R/W | 8 | 28Ah | MIF BANK 2 TIMING PARAMS |
| | R/W | | | |
| B3CFG | R/W | 8 | 28Ch | MIF BANK 3 CONFIG |
| B3AM | R/W | 8 | 28Ch | MIF BANK 3 BASE ADDRESS |
| B3TMG | R/W | 8 | 28Eh | MIF BANK 3 TIMING PARAMS |
| | R/W | | | |
| B4CFG | R/W | 8 | 290h | MIF BANK 4 CONFIG |
| B4AM | R/W | 8 | 291h | MIF BANK 4 BASE ADDRESS |
| B4TMG | R/W | 8 | 292h | MIF BANK 4 TIMING PARAMS |
| | R/W | | | |
| B5CFG | R/W | 8 | 294h | MIF BANK 5 CONFIG |
| B5AM | R/W | 8 | 295h | MIF BANK 5 BASE ADDRESS |
| B5TMG | R/W | 8 | 296h | MIF BANK 5 TIMING PARAMS |
| | R/W | | | |
| MBCL | R/W | 8 | 2BEh | MIF MEMORY BANK CONFIGURATION LOCK REGISTER |
| RFSH | R/W | 8 | 2BFh | MIF REFRESH CONTROL |

FIG. 5

| B0CFG[3] | B0CFG[2] | B0CFG[1] | B0CFG[0] | BANK 0 SIZE | BANK 0 ADDRESS RANGE |
|---|---|---|---|---|---|
| 1 | 0 | 0 | 0 | 64K BYTES | 000000h-00FFFFh |
| 1 | 0 | 0 | 1 | 128K BYTES | 000000h-01FFFFh |
| 1 | 0 | 1 | 0 | 256K BYTES | 000000h-03FFFFh |
| 1 | 0 | 1 | 1 | 512K BYTES | 000000h-07FFFFh |
| 1 | 1 | 0 | 0 | 1M BYTES | 000000h-0FFFFFh |
| 1 | 1 | 0 | 1 | 2M BYTES | 000000h-1FFFFFh |
| 1 | 1 | 1 | 0 | 4M BYTES | 000000h-3FFFFFh |
| 1 | 1 | 1 | 1 | 8M BYTES | 000000h-7FFFFFh |

FIG. 6

| B1CFG[3:0] | BANK SIZE | LOGICAL ADDRESS BIT | | | | | | | | | | | | |
|---|---|---|---|---|---|---|---|---|---|---|---|---|---|---|
| | | a23 | a22 | a21 | a20 | a19 | a18 | a17 | a16 | a15 | a14 | a13 | a12 | a11-a0 |
| 00xx | RESERVED | | | | | | | | | | | | | |
| 0100 | 4 KBYTES | MRB23 | MRB22 | MRB21 | MRB20 | MRB19 | MRB18 | MRB17 | MRB16 | BiAM7 | BiAM6 | BiAM5 | BiAM4 | 0 |
| 0101 | 8 KBYTES | MRB23 | MRB22 | MRB21 | MRB20 | MRB19 | MRB18 | MRB17 | MRB16 | BiAM7 | BiAM6 | BiAM5 | 0 | 0 |
| 0110 | 16 KBYTES | MRB23 | MRB22 | MRB21 | MRB20 | MRB19 | MRB18 | MRB17 | MRB16 | BiAM7 | BiAM6 | 0 | 0 | 0 |
| 0111 | 32 KBYTES | MRB23 | MRB22 | MRB21 | MRB20 | MRB19 | MRB18 | MRB17 | MRB16 | BiAM7 | 0 | 0 | 0 | 0 |
| 1000 | 64 KBYTES | BiAM7 | BiAM6 | BiAM5 | BiAM4 | BiAM3 | BiAM2 | BiAM1 | BiAM0 | 0 | 0 | 0 | 0 | 0 |
| 1001 | 128 KBYTES | BiAM7 | BiAM6 | BiAM5 | BiAM4 | BiAM3 | BiAM2 | BiAM1 | 0 | 0 | 0 | 0 | 0 | 0 |
| 1010 | 256 KBYTES | BiAM7 | BiAM6 | BiAM5 | BiAM4 | BiAM3 | BiAM2 | 0 | 0 | 0 | 0 | 0 | 0 | 0 |
| 1011 | 512 KBYTES | BiAM7 | BiAM6 | BiAM5 | BiAM4 | BiAM3 | 0 | 0 | 0 | 0 | 0 | 0 | 0 | 0 |
| 1100 | 1 MBYTES | BiAM7 | BiAM6 | BiAM5 | BiAM4 | 0 | 0 | 0 | 0 | 0 | 0 | 0 | 0 | 0 |
| 1101 | 5 MBYTES | BiAM7 | BiAM6 | BiAM5 | 0 | 0 | 0 | 0 | 0 | 0 | 0 | 0 | 0 | 0 |
| 1110 | 4 MBYTES | BiAM7 | BiAM6 | 0 | 0 | 0 | 0 | 0 | 0 | 0 | 0 | 0 | 0 | 0 |
| 1111 | 8 MBYTES | BiAM7 | 0 | 0 | 0 | 0 | 0 | 0 | 0 | 0 | 0 | 0 | 0 | 0 |

FIG. 7

| DATA BUS WIDTH | NUMBER OF BYTES | BiMX1 BiMX0 | ADDRESS MUX SCHEME |
|---|---|---|---|
| 8-BIT BUS | 256 KBYTES | 00 | A |
| | 1 MBYTES | 01 | B |
| | 4 MBYTES | 10 | C |
| | 8 MBYTES | 11 | D |
| 16-BIT BUS | 256K DEEP (512 KBYTES TOTAL) | 00 | E |
| | 1M DEEP (2 MBYTES TOTAL) | 01 | F |
| | 4M DEEP (8 MBYTES TOTAL) | 10 | G |
| | RESERVED | 11 | - |

FIG. 8

| ADDRESS MUX SCHEME | | A17 | A16 | A15 | A14 | A13 | A12 | A11 | A10 | A9 | A8 | A7 | A6 |
|---|---|---|---|---|---|---|---|---|---|---|---|---|---|
| | | | | | | ADDRESS PIN | | | | | | | |
| A | ROW | a17 | a16 | a15 | a14 | a13 | a12 | a11 | a10 | a9 | u | u | u |
| | COLUMN | a8 | a7 | a6 | a5 | a4 | a3 | a2 | a1 | a0 | u | u | u |
| B | ROW | a17 | a16 | a15 | a14 | a13 | a12 | a11 | a10 | a9 | a8 | u | u |
| | COLUMN | a18 | a7 | a6 | a5 | a4 | a3 | a2 | a1 | a0 | a19 | u | u |
| C | ROW | a17 | a16 | a15 | a14 | a13 | a12 | a11 | a10 | a9 | a8 | a7 | u |
| | COLUMN | a18 | a20 | a6 | a5 | a4 | a3 | a2 | a1 | a0 | a19 | a21 | u |
| D | ROW | a17 | a16 | a15 | a14 | a13 | a12 | a11 | a10 | a9 | a8 | a7 | a6 |
| | COLUMN | a18 | a20 | a22 | a5 | a4 | a3 | a2 | a1 | a0 | a19 | a21 | u |
| E | ROW | a17 | a16 | a15 | a14 | a13 | a12 | a11 | a10 | a9 | u | u | u |
| | COLUMN | a8 | a7 | a6 | a5 | a4 | a3 | a2 | a1 | a18 | u | u | u |
| F | ROW | a17 | a16 | a15 | a14 | a13 | a12 | a11 | a10 | a9 | a8 | u | u |
| | COLUMN | a19 | a7 | a6 | a5 | a4 | a3 | a2 | a1 | a18 | a20 | u | u |
| G | ROW | a17 | a16 | a15 | a14 | a13 | a12 | a11 | a10 | a9 | a8 | a7 | u |
| | COLUMN | a19 | a21 | a6 | a5 | a4 | a3 | a2 | a1 | a18 | a20 | a22 | u |

NOTE 1. USE TABLE 3-6 TO DETERMINE ADDRESS MUX SCHEME AND [BiMX1 BiMX0] VALUES.
NOTE 2. DURING RAS, THE LOGICAL ADDRESS AND THE ADDRESS PIN ARE ALWAYS IDENTICAL.

FIG. 9

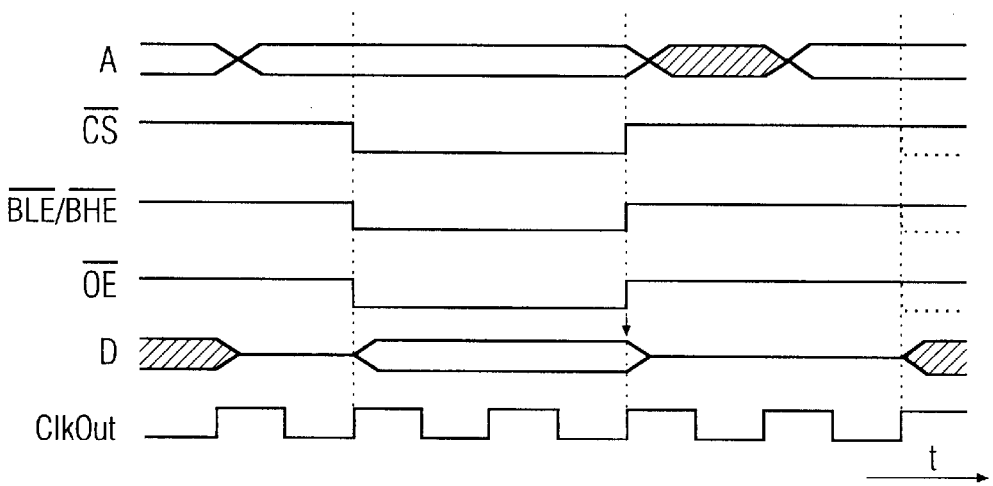

FIG. 10
(PRIOR ART)

MEMORY INTERFACE UNIT WITH PROGRAMMABLE STROBES TO SELECT DIFFERENT MEMORY DEVICES

FIELD OF THE INVENTION

The present invention relates to a memory interface unit for coupling a microprocessor to a memory external to the microprocessor, and to input/output devices of a memory-mapped type.

BACKGROUND OF THE INVENTION

In the U.S. Pat. No. 5,761,478, a programmable memory interface is disclosed for efficient transfer of different size data between a microprocessor of a given data and address bus width and memory banks of various data and address width, typically differing from the widths of the microprocessor's buses. In the examples given, the microprocessor, which has a 32 bit internal architecture, can execute programming code from 16 or 32 bit wide external memories, and can load and store 8, 16, and 32 bit data units into external memory and convert them into an internally equivalent 32 bit representation. Depending on the widths of the external memory banks, one external pin configures the memory width to 16 or 32 bit, and two sets of memory strobes and one I/O (input/output) strobe allow zero glue logic to two banks of memory and one bank of external peripherals. For 16 or 8 bit memories, one or two of four pins, otherwise all used as strobe-byte enable pins, are used as additional address pins. The behavior of the pins is manipulated according to the contents of certain registers. All memory banks are of the same directly addressable type. What is thus missing but needed is interfacing to mixed types of memory units, i.e, to generic memories such as ROM, SRAM, EPROM, Flash Memory, and memory-mapped I/O-devices on the one hand, and volatile memories such as DRAM which need refreshing on the other hand.

In the U.S. Pat. No. 4,349,870, a microcomputer with a programmable multi-function port is disclosed. One of a plurality of ports is user programmable by application of specific signals to mode selection pins. The programmable port comprises a number of lines which can be programmed as input or output lines to peripheral equipment, or, alternatively, can be programmed to serve as a bi-directional data bus to external memory.

In the U.S. Pat. No. 4,028,682, a circuit is disclosed for selecting the function of connecting contacts on circuit chips. Contacts can be selectively designated as either an input or an output contact.

In the U.S. Pat. No. 5,261,116, a programmable, expandable controller with flexible I/O is disclosed. An output buffer includes multiplexers which permit either a program counter or a control field to be multiplexed to output pins of a device. When the program counter is multiplexed to the output pins, the programmable controller can address external memory devices.

SUMMARY OF THE INVENTION

It is an object of the invention to provide a memory interface unit for flexibly coupling a microprocessor to a plurality of memory banks of different type, notably a mixture of generic type memory banks, such as ROM, EPROM, SRAM, Flash Memory, and memory-mapped I/O devices, and DRAMs.

It is another object of the invention to flexibly interface memory banks of different sizes, different bus width, different access times, different base addresses in a microprocessor memory space.

It is a further object of the invention to speed up program execution after booting up at a microprocessor reset.

It is still a further object to flexibly interface directly addressable memory-mapped input/output devices.

In accordance with the invention, a memory interface unit for coupling a microprocessor to a memory external to the microprocessor is provided, said memory being provided in the form of a plurality of memory banks, each of the memory banks being provided with address lines and data lines, at least a first memory bank of the plurality of memory banks being of a first type which is directly addressable, which first memory bank has a chip select input for selecting the first memory bank, and a second memory bank of the plurality of memory banks being of a second type, which is addressable by a row address and a column address, the row address being validated by a row address strobe at a row address strobe input of the second memory bank, and the column address being validated by a column address strobe at a column address strobe input of the second memory bank, said memory interface unit comprising:

unique strobes for each of the plurality of memory banks, which unique strobes are programmable in dependence of a type of memory bank to which a particular unique strobe relates, a first strobe of the unique strobes being programmed as a chip select signal which is inputted to the chip select input of the first memory bank, and a second strobe of the unique strobes being programmed as the row address strobe inputted to the row address strobe input of the second memory bank.

Preferably, the first memory bank is a non-volatile memory such as a ROM comprising executable code, located at a hard wired fixed address within the address space, and the second memory bank is volatile memory, preferable of DRAM type, the first and second memory bank being swapped after moving the executable code, and memory-mapped registers being defined in the second memory bank for at least configuring types, base addresses, sizes, bus widths, and access times of the memory banks.

BRIEF DESCRIPTION OF THE DRAWINGS

FIG. 4 shows special function register addresses of special function memory-mapped registers for use with a memory interface unit.

FIG. 5 shows a set of memory-mapped memory interface unit registers.

FIG. 6 shows bank 0 size and address range selection.

FIG. 7 shows bank 1–5 size and base address selection.

FIG. 8 shows a configuration of row/column multiplexer bits for specific DRAMs.

FIG. 9 shows DRAM row and column address multiplexing schemes.

FIG. 10 shows a typical SRAM 16-bit bus read cycle.

DESCRIPTION OF THE PREFERRED EMBODIMENT

Figure 1:
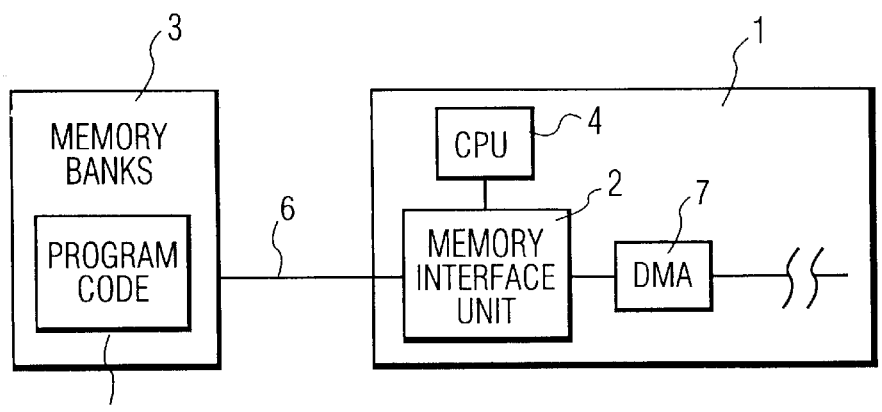
FIG. 1 schematically shows a microcontroller with a memory interface unit which is coupled to a memory.

FIG. 1 schematically shows a microcontroller 1 with a memory interface unit 2 which is coupled to a memory 3, which comprises a plurality of memory banks of mixed generic and DRAM types. The microcontroller 1 further comprises a microprocessor 4, also indicated with CPU, which is coupled to the memory interface unit 2 for controlling the same when executing program code 5 stored in the memory 2, after a microcontroller reset. An address/data/control bus 6 is provided between the memory interface unit 2 and the memory 3. Further shown is a DMA control unit 7 which is coupled to the memory interface unit 2. The DMA control unit 7 controls a plurality of peripherals (not shown) such as data communication peripherals. The CPU (Central Processing Unit) and the DMA (Direct Memory Access) controller 7 can request access to the bus 6, access being granted on the basis of bus arbitration and priority schemes. Such a bus requesting and granting mechanism is well-known in the art.

In the following description, active low signals, as indicated in the drawing with a line above a group of characters, are indicated with the symbol ⁻, preceding the group of characters, i.e., if a group of characters ABC indicates an active high logical signal, ⁻ABC indicates the corresponding active low logical signal.

Figure 2:
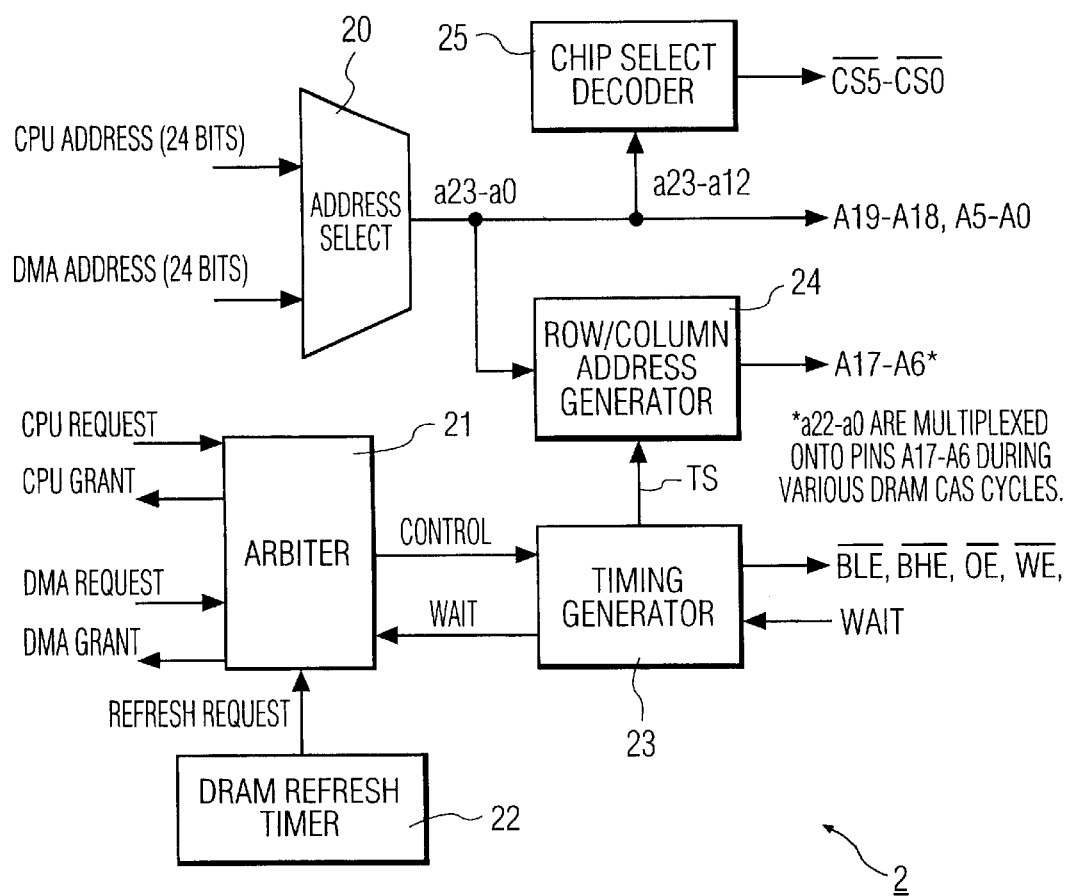
FIG. 2 is a block diagram of a memory interface unit.

FIG. 2 is a block diagram of the memory interface unit 2. The memory interface unit 2 comprises an address selector 20 for selecting a 24 bits CPU address or a 24 bits DMA address on the basis of a granted bus request from the CPU or the DMA controller 6, respectively, bus requesting and granting being controlled by an arbiter 21. The arbiter 21 is further coupled to a DRAM (Dynamic Random Access Memory) refresh timer 22 for also arbitrating DRAM refresh requests, and to a timing generator 23. The arbiter 21 controls the timing generator 23 which provides timing signals TS to a row/column address generator 24 which generates row and column addresses onto external address pins A17–A6 (i.e., 12 bits) from multiplexed CPU or DMA address bit a22–a0 (i.e, 23 bits) during various DRAM CAS (Column Address Strobe) cycles. The timing generator 23 further generates global strobe signals to strobe the memory banks included in the memory 3, such global strobe signals including a byte low enable signal ⁻BLE, a byte high enable signal ⁻BHE, an output enable signal ⁻OE, and a write enable signal ⁻WE. An external signal WAIT is available after reset. A chip select decoder 25 is coupled to the address selector 20. In the example given, up to a maximum of six memory banks can be selected, six unique programmable strobes ⁻CS0, ⁻CS1, ⁻CS2, ⁻CS3, ⁻CS4, and ⁻CS5 being available from the chip select decoder 25 for selecting each memory bank. A unique programmable strobe is physically connected to a chip select pin ⁻CS of a generic memory device such as an ROM or SRAM device, or to a ⁻RAS pin of a DRAM device, and is programmed accordingly. The chip select decoder 25 compares the most significant address bits of all memory addresses to base addresses, i.e., start addresses in a microprocessor memory space, of the maximally memory banks, and asserts the ⁻CS pin for that bank which matches. In the example given, memory bank addresses are on 4 KByte boundary, so a maximum of 12 bits need to be compared only, namely the most significant address bits, indicated by a23–a12. DRAM logical address bits a22–a0 are multiplexed onto address pins A17–A6 during the row and column phases by row/column address multiplexing. Generic memory logical addresses, a19–a0, appear on external address pins A19–A0 directly. Correct read/write bus cycle timing for each bank, programmed in a bank's timing register, is applied via the timing generator 23 whenever the bank is selected. The memory interface unit 2 uses five special function registers and twenty memory mapped registers, which will be described in the following.

Figure 3:
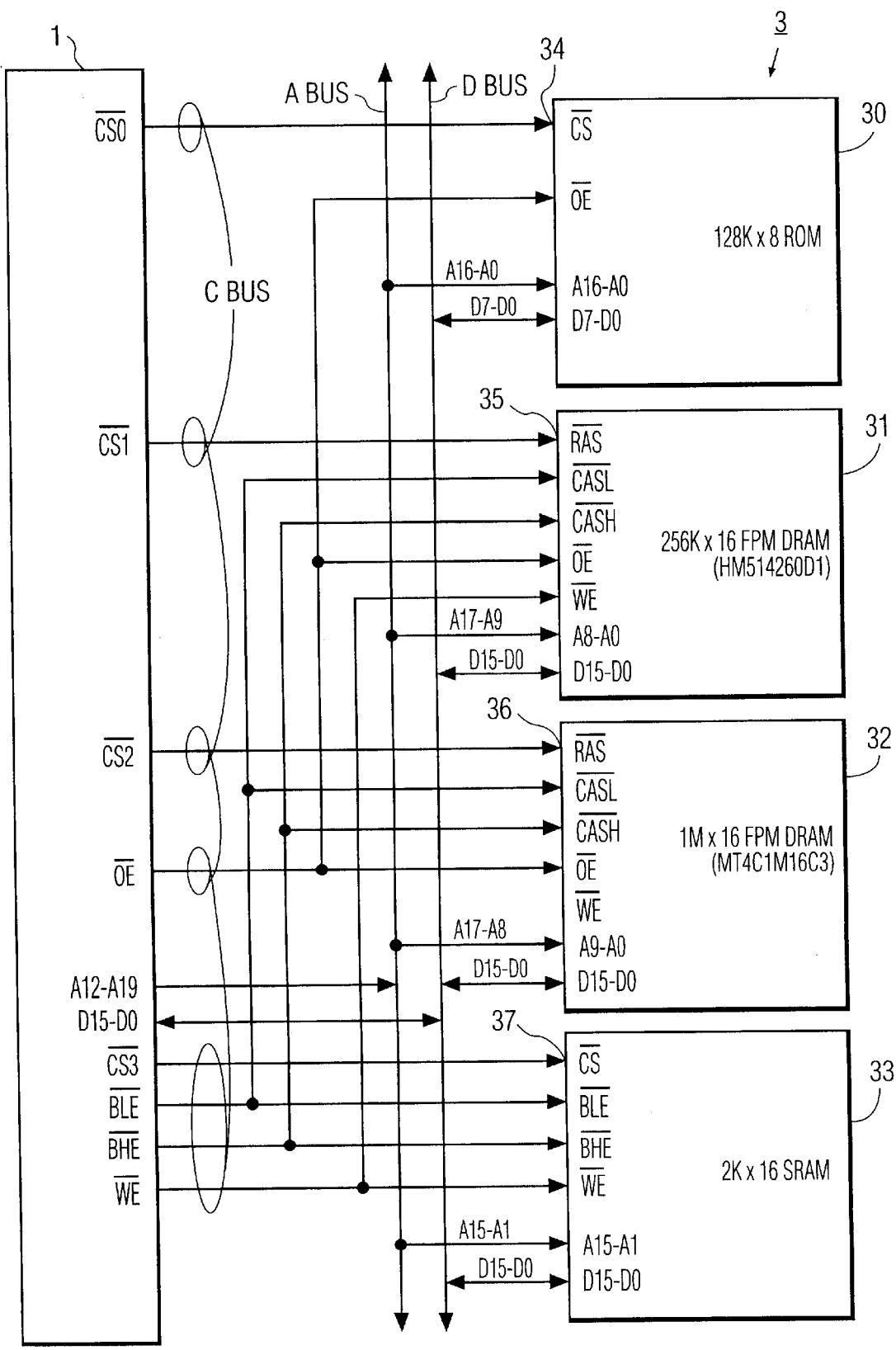
FIG. 3 shows an embodiment of a configuration of a memory interface unit.

FIG. 3 shows an embodiment of a configuration of the memory interface unit 2. In the example given, the memory 3 has four memory banks, a ROM memory bank 30 of 128K×8, i.e., 128 KBytes with a data bus width of 8 bits, indicated by D7–D0, a DRAM memory bank 31 of 256K×16, i.e, 512 KBytes of memory with a data bus width of 16 bits, indicated by D15–D0, a further DRAM memory bank 32 of 1M×16, i.e., 16 MBytes of memory with a data bus of 16 bits, and an SRAM memory bank 33 of 2K×16, i.e., 4 KBytes of memory with a data bus width of 16 bits. The memory bank 30, also being referred to as bank-0, comprises program code and starts at a hard wired fixed base address 000000h in the microprocessor's memory space, 'h' indicating a hexadecimal address notation. The memory banks 31, 32, and 33 are also referred to as bank-1, bank-2, and bank-3. With a maximum of six banks, the banks are thus referred to as bank-I, i=0, 1, 2, 3, 4, and 5. According to the invention, the memory interface 2 is configured to meet all type, size, base address, width, and timing requirements of the memory banks. Further shown in FIG. 3 are an external address bus ABUS, an external data bus DBUS, and an external control bus CBUS. The memory interface chip select signals ⁻CS0, ⁻CS1, ⁻CS2, and ⁻CS3 are connected to the chip select input 34 of the ROM 30, to the row address strobe input 35 of the DRAM 31, to the row address strobe input 36 of the DRAM 32, and to the chip select input 37 of the SRAM 33, respectively. As regards the DRAMs 31 and 32, respective column address strobe inputs are shown, indicated by ⁻CASL and ⁻CASH, column address strobe high and low, respectively. With a properly configured memory interface, a glueless interface is obtained to the memory 3.

FIG. 4 shows special function register addresses of special function memory-mapped registers used to program the memory interface unit 2, a bus timing register high BTRH, a bus timing register low BTRL, a memory mapped register base address high MRBH, a memory mapped register base address low BRBL, and a memory interface general configuration register MICFG. The register MRBH contains the high order byte of the MMR base address, address bits A23–A16, indicated by MA23–MA16. The register MRBL contains the lowest four bits of the MMR (memory mapped register) base address, address bits A15–A12, indicated by MA15, MA14, MA13, and MA12. The LSB (least significant bit) is MRBE, a logic "0" disabling access to the MMRs, and a logic "1" enabling access to the MMRs. The MMR base address is formed by the twelve bits MA23–MA12, padded by twelve zero bits, and is compared to address bits a23–a12 from the CPU to initiate MMR accesses. The register MICFG contains only one functional bit, the bit CLKOE (Clock Output Enable) which is set at a microprocessor reset. FIG. 5 shows a set of memory-mapped memory interface unit registers. For each memory bank there are three registers, a bank-i configuration register BiCFG, a bank-i base address/DRAM address multiplexer control register BiAM, and a bank-i timing register BiTMG, i=0, 1, 2, 3, 4, and 5. There are two further registers, a memory bank configuration lock register MCBL and a refresh control register RFSH. Bits of the configuration register BiCFG determine whether a bank is code and/or data memory access enabled, and determine a bank's bus width, 8 or 16 bit, type, generic or DRAM, and size, between 64 KBytes and 8 MBytes for bank-0 and between 4 KBytes and 8 MBytes for bank-1 to bank-5. Bits of the BiAM register have different functions, depending on a memory bank's type and size. For a generic type of memory bank of 64 KBytes or higher, the bank's base address is formed by the bits of the MRBH register and the four MSBs (Most Significant Bits) of the BiAM register, for a generic type of memory bank of 32 KBytes or smaller, all bits of the BiAM register for the bank's base address, and for a DRAM memory bank, the six MSBs of the BiAM register are used as address bits a23–a18 of the base address. Then, the two least significant bits of the BiAM are row/column address multiplexer control bits BiMX1 and BiMX0, to be described in more detail in relation to FIG. 8. Bits of the BiTMG register determine ‾CS to ‾WE delay for generic type memory banks, ‾RAS to ‾CAS delay for DRAM memory banks, in clock cycles, and other access timing parameters. The MCBL register's MSB enables or disables memory bank-0/bank-1 swapping, bank swapping being disabled upon reset, and further bits determine configuration locking/unlocking of the different memory banks. Bits of the RFSH register enable/disable the refresh timer 22, and determine a seven-bit time constant for the refresh timer 22. The timer will time out once every 8×RFSH[6:0] system clock cycles, [6:0] indicating the seven LSBs of the RFSH register. On each refresh timer time out, a request is sent to the arbiter 21.

FIG. 6 shows bank-0 size and address range selection. Bank-0's base address is hard wired and is set to 000000h. Shown are bit/settings of the B0CFG register to set the bank's size and address range. Bank-0 is the boot bank. Bank-0 is always enabled for code memory access and can be enabled for data memory access.

FIG. 7 shows bank 1–5 size and base address selection. Bank-1 to bank-5 size and address selection is determined by bit settings of the BiCFG register, the NMR register, and the BiAM register, as shown, lower address bits being zero, as the case may be. Banks bank-1 to bank-5 can be configured as either a generic memory or a DRAM. After boot up, application code stored in bank-0, a ROM, will be written into bank-1, preferably a DRAM memory bank, for subsequent execution. After bank-0/bank-1 swapping, the application code can still be accessed from base address 000000h. Bank swapping also allows interrupt vectors, which are in low memory, to be write accessed. The advantage of such a bank swapping is that the application code is executed substantially faster.

FIG. 8 shows a configuration of row/column multiplexer bits for specific DRAMs. The two least significant bits of the BiAM register, the row/column address multiplexer control bits BiMX1 and BiMX0, determine multiplex scheme A through G for various data bus width and memory sizes.

FIG. 9 shows the DRAM row and column address multiplexing schemes A through G in relation to the assignment of logical addresses a23–a0 to the external pins A17–A6 during the row and column address phases of a DRAM access, 'u' indicating unused pins. In the example given, so-called ‾CAS before ‾RAS refresh is performed.

With the definition and description of all necessary memory interface registers above, the embodiment of the configuration of the memory interface unit 2 as shown in FIG. 3 will now be described in more detail.

Bank 30, the boot bank, and bank 31, the first DRAM bank, are first configured after a reset. Bank 30 has address range 000000h–01FFFFh as indicated by the register B0CFG described in FIG. 6. Bank 31 has address range 100000h–17FFFFh as indicated by the registers B1CFG, MRB, and B1AM described in FIG. 7. Similarly, sizes and ranges of banks 32 and 33 are indicated.

After final bank swapping, the address ranges and sizes of bank 30 and bank 31 are interchanged, the then address range of bank 31, 10000h–11FFFFh activating the ROM on CS0, and the then address range 000000h–07ffffh activating the DRAM on ‾CS1. Before bank swapping, the banks are configured as follows. The MRBH register is set to FFh, indicating M base address bits a23–16. The MRBL register is set to F1h, bits [3:1] of the MRBL register being don't cares, and MMR access is enabled. Then, the MCBL register is set to lock the registers for banks 4 and 5, which are not present, and to unlock the registers for banks 3-0. Among other settings, bank 30 is data access disabled. Bank 31 is set to two cycle ‾RAS to ‾CAS delay, and to two cycle delay from data strobes low to sampling of the data bus or latching data into memory, by appropriate settings of the B1TMG register. The B1CFG register is set to code and data enable the memory bank 31 and to indicate a DRAM type memory of size 512 KBytes of 16 bit words. The B1AM register is set to 10h, indicating a bank 31 base address 100000h and indicating multiplexing scheme E as described in FIGS. 8 and 9. Banks 32 and 33 are configured correspondingly. The refresh timing register RFSH is configured. The two DRAMs 31 and 32 have the same refresh cycle timing requirement. If they were different, the shortest cycle would be chosen. Upon configuration of the memory banks 1–3, the application code, and any other data is moved from the ROM 30 to the DRAM 31. Then, bank swapping is performed.

The timing examples of FIGS. 10–13 illustrate the effects of memory interface settings, particularly the effects of the settings of the register BiTMG.

Figure 11:
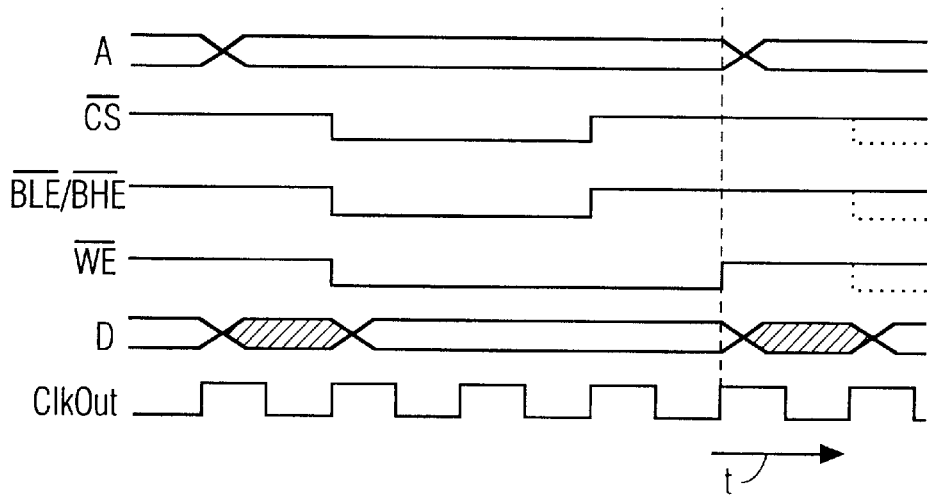
FIG. 11 shows a typical SRAM 16-bit bus write cycle.

FIG. 10 shows a typical SRAM 16-bit bus read cycle in accordance with a preferred embodiment of the present invention. Access time is set to 2 clock cycles. On a rising edge of ClkOut, the address is driven onto the address bus ABUS. One clock cycle after the address changes, ‾CS and ‾OE go active. ‾BLE/‾BHE go active on the same cycle. The data bus DBUS is sampled on the rising edge of ClkOut, 2 cycles later. At this point, the read cycle is terminated as ‾CS, ‾BLE/‾BLH, and ‾OE are negated, and the address buss ABUS and the data bus DBUS begin to change FIG. 11 shows a typical SRAM 16-bit bus write cycle in accordance with a preferred embodiment of the present invention. On the rising edge of ClkOut, the address is driven onto the address bus ABUS. One clock cycle later, ‾CS goes active. ‾BLE/‾BHE go active on the same cycle. At this point, the data are driven onto the data bus DBUS. Two clock cycles later, on the rising edge of ClkOut, the data are latched into memory by the rising edge of ‾BLE/‾BHE. ‾CS is also negated on this cycle. One clock cycle later, ‾WE is negated, terminating the write cycle, and the address bus ABUS and the data bus DBUS change. For a generic type of memory bank, such as an SRAM, a ‾BLE/‾BHE bus strobe acts as a data strobe.

Figure 12:
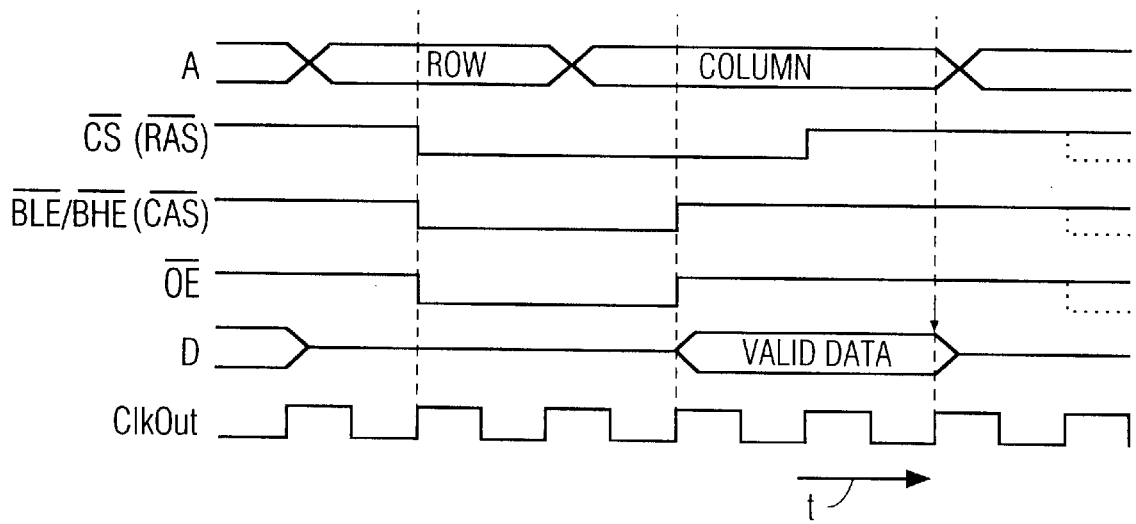
FIG. 12 shows a typical DRAM 16-bit read cycle.

FIG. 12 shows a typical DRAM 16-bit read cycle in accordance with a preferred embodiment of the present invention. In the BTMG register, the RAS to ‾CAS delay is set to two clock cycles. On the rising edge of ClkOut, the row address is multiplexed onto pins A17–A6. One clock cycle later, ‾CS(‾RAS) and ‾OE go active. One clock cycle after ‾RAS, the column address is multiplexed onto the address bus. Two clock cycles after ‾RAS, ‾BLE/‾BHE go active. After the DRAM's access time has elapsed, the DRAM drives the data onto the data bus. One clock cycle before the negation of ‾BLE/‾BHE (‾CAS) are asserted, the data bus is sampled on the rising edge of ‾BLE/‾BHE, ‾OE is also negated, and the address bus changes. For a DRAM type of memory, the ‾BLE/‾BHE bus strobe acts as a ‾CAS strobe.

Figure 13:
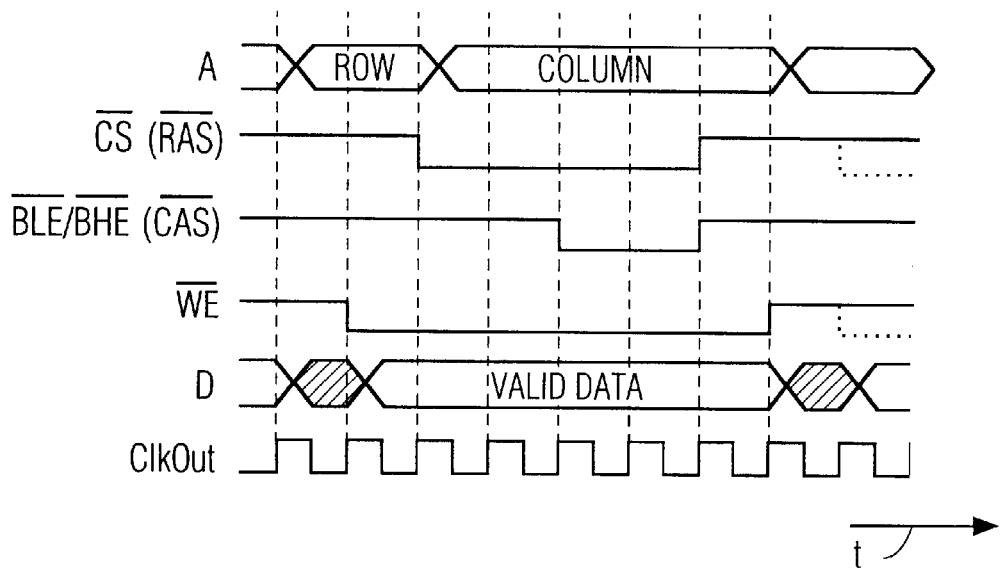
FIG. 13 shows a typical DRAM 16-bit write cycle.

FIG. 13 shows a typical DRAM 16-bit write cycle in accordance with a preferred embodiment of the present invention. The register BTMG is set to an access time of two clock cycles. On a rising edge of ClkOut, the row address is multiplexed onto the pins A17–A6. One clock cycle later, ⁻CS (⁻RAS) and ⁻WE go active, and the data are driven onto the data bus. One clock cycle after ⁻CS (⁻RAS), the column address is multiplexed onto the address bus. Two clock cycles after ⁻CS (⁻RAS), because the ⁻RAS to ⁻CAS delay is two clock cycles, ⁻BLE/⁻BHE go active. Two clock cycles after ⁻BLE/⁻BHE, because access time is two clock cycles, the data are latched into memory by the rising edge of ⁻BLE/⁻BHE, and ⁻CS (⁻RAS) is negated simultaneously. Write data will remain valid for another clock cycle. One clock cycle after ⁻CS (⁻RAS) goes high, the address bus changes, and the write cycle is terminated by the rising edge of ⁻WE.

Figure 14:
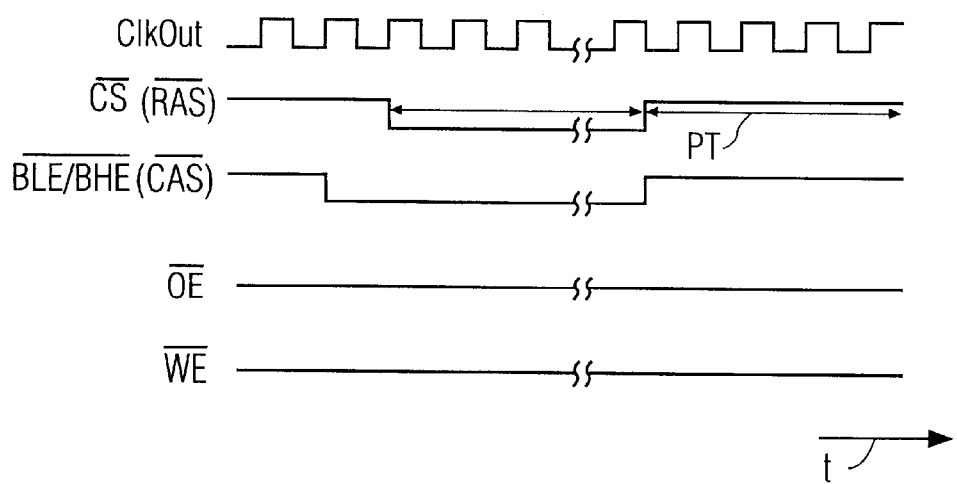
FIG. 14 shows a DRAM refresh cycle.

FIG. 14 shows a DRAM refresh cycle. First the strobe ⁻BLE/⁻BHE, acting as a ⁻CS (⁻CAS) strobe, is asserted with ⁻WE and ⁻OE negated. One clock cycle later, a ⁻CS (⁻RAS) is asserted for all memory banks configured for DRAMs. Then, for all DRAMs, after a given number of clock cycles after the falling edge of ⁻CS (⁻RAS), the ⁻CS (⁻RAS) and ⁻BLE/⁻BHE(⁻CAS) are negated. In the example given, a recovery time RT is four clock cycles. The shown DRAM refresh cycle is a so-called ⁻CAS before ⁻RAS refresh cycle, in which the unique ⁻CS(⁻RAS) strobe and global bus strobe ⁻BLE/⁻BHE(⁻CAS) cooperate to perform the refresh cycle. At every occurrence of the combined ⁻CS(⁻RAS) and ⁻BLE/⁻BHE(⁻CAS) strobes, a column in the DRAM will be refreshed.

In view of the foregoing, it will be evident to a person skilled in the art that various modifications may be made within the spirit and the scope of the invention as hereinafter defined by the appended claims and that the invention is thus not limited to the examples provided.

What is claimed is:

1. A memory interface unit for coupling a microprocessor to a memory external to the microprocessor, said memory being provided in the form of a plurality of memory banks, each of the memory banks being provided with address lines and data lines, at least a first memory bank of the plurality of memory banks being of a first type which is directly addressable, which first memory bank has a chip select input for selecting the first memory bank, and a second memory bank of the plurality of memory banks being of a second type, which is addressable by a row address and a column address, the row address being validated by a row address strobe at a row address strobe input of the second memory bank, and the column address being validated by a column address strobe at a column address strobe input of the second memory bank, said memory interface unit comprising:

address selection means for receiving a first address corresponding to the first memory bank, a second address corresponding to the second memory bank, and a bus arbitration signal indicating which of the first address and the second address is to be selected; and unique strobes for each of the plurality of memory banks, which unique strobes are programmable in dependence of a type of memory bank to which a particular unique strobe relates, a first strobe of the unique strobes being programmed as a chip select signal which is inputted to the chip select input of the first memory bank, and a second strobe of the unique strobes being programmed as the row address strobe inputted to the row address strobe input of the second memory bank; wherein the first memory bank is of non-volatile type in which executable code is stored including boot up code, and after execution of the boot up code at a microprocessor reset the executable code is moved from the first memory bank to the second memory bank; and wherein after moving the executable code the first and second memory banks are swapped so that the executable code is executable from the same base address as before swapping.

2. The memory interface unit of claim 1, comprising first configuration means for configuring types of the memory banks.

3. The memory interface unit of claim 1, comprising second configuration means for configuring base addresses and sizes of the memory banks, within an addressable range of the microprocessor.

4. The memory interface unit of claim 1, comprising third configuration means for configuring bus widths of the memory banks.

5. The memory interface unit of claim 1, comprising fourth configuration means for configuring access times of the memory banks.

6. The memory interface unit of claim 1, wherein the memory bank to be configured is a memory bank of the first type and an access time is configured as being a multiple of microprocessor clock cycles between asserting a data strobe to the memory bank of the first type and sampling of a data bus, in case of a read operation, and between asserting the data strobe and latching of data into the memory bank, in case of a write operation.

7. The memory interface unit of claim 1, wherein the memory bank to be configured is a memory bank of the second type and an access time is configured as being a multiple of microprocessor clock cycles between asserting a row address strobe and a column address strobe.

8. The memory interface unit of claim 1, for further coupling the microprocessor to an input/output device of a directly addressable memory-mapped input/output type.

9. The memory interface unit of claim 1, wherein a global bus strobe is asserted which acts as a data strobe for a memory bank of the first type and which acts as a column address strobe for a memory bank of the second type.

10. A computer system, comprising:

a processor, coupled to a memory interface;

a first memory bank with program code stored therein, the first memory bank coupled to the memory interface to receive at least a first chip select signal;

a second memory bank coupled to the memory interface to receive at least a second chip select input signal;

wherein the memory interface is adapted to, at a first time period, receive a first address and responsive thereto generate the first chip select signal, and receive a second address and responsive thereto generate the second chip select input signal; and further adapted to, at a second time period, the second time period being subsequent to a transfer of the program code from the first memory bank to the second memory bank, receive the first address and generate the second chip select input signal.

11. The computer system of claim 10, wherein the first memory bank comprises non-volatile memory.

12. The computer system of claim 11, further comprising a direct memory access (DMA) controller coupled to the memory interface.

13. The computer system of claim 12, wherein the second memory bank comprises static random access memory (SRAM).

14. The computer system of claim 12, wherein the second memory bank comprises dynamic random access memory (DRAM).

15. A method of operating a computer system, comprising:
resetting a processor;
performing a first programming of a plurality of configuration registers in a memory interface, the configuration registers adapted to provide control information for the operation of the memory interface;
transferring data stored in a first memory bank having a first base address, to a second memory bank having a second base address, the first base address being different from the second base address; and
performing, subsequent to transferring the data from the first memory bank to the second memory bank, a second programming of the plurality of configuration registers such that the second memory bank is accessed at addresses using the first base address;
wherein the data transferred from the first memory bank to the second memory bank represents instructions to be executed by the processor.

16. The method of claim 15, further comprising:
selecting, at the memory interface, one of an address received from the processor, and an address received from a DMA controller.

17. The method of claim 16, further comprising:
accessing and executing instructions from the second memory bank.

18. The method of claim 16, wherein the first memory bank comprises a non-volatile memory having first access characteristics, and the second memory bank comprises a volatile memory having second access characteristics.

19. The method of claim 18, wherein the first and second access characteristics are such that instructions in the second memory bank can be accessed in less time than instructions in the first memory bank.

* * * * *